US006454158B1

(12) United States Patent
Takahashi

(10) Patent No.: US 6,454,158 B1
(45) Date of Patent: Sep. 24, 2002

(54) WIRE BONDING APPARATUS AND WIRE BONDING METHOD OF SEMICONDUCTOR DEVICE

(75) Inventor: Yoshiharu Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/617,250

(22) Filed: Jul. 14, 2000

(30) Foreign Application Priority Data

Mar. 1, 2000 (JP) ........................................ 2000-055374

(51) Int. Cl.[7] ................................................. B23K 1/06
(52) U.S. Cl. .................................. 228/180.5; 228/110.1
(58) Field of Search ........................... 228/180.5, 110.1; 257/669, 672, 698, 667, 666

(56) References Cited

U.S. PATENT DOCUMENTS 5,238,174 A * 8/1993 Ricketson et al.
5,683,944 A   11/1997 Joiner et al.
5,776,799 A * 7/1998 Song et al.
5,789,806 A   8/1998 Chua et al.
5,920,116 A * 7/1999 Umehara et al.

FOREIGN PATENT DOCUMENTS

JP            57-46605         10/1982

* cited by examiner

*Primary Examiner*—M. Alexandra Elve
*Assistant Examiner*—Jonathan Johnson
(74) *Attorney, Agent, or Firm*—Leydig, Voit & Mayer, Ltd.

(57) ABSTRACT

A wire bonding apparatus for connecting a semiconductor device including a semiconductor chip, to a lead frame having a die pad to which the semiconductor chip is joined, through a plurality of inner leads aligned along a periphery of the die pad at intervals. The apparatus includes a heat block having an inner lead mounting portion for mounting the inner leads, a concave portion located inward of the inner lead mounting portion, and at least one supporting pad for mounting the semiconductor chip. Restoration of the lead frame at wire bonding portions is decreased at the time a lead frame forcing mold holding the lead frame to heat block is detached.

6 Claims, 13 Drawing Sheets

WIRE BONDING APPARATUS AND WIRE BONDING METHOD OF SEMICONDUCTOR DEVICE

BACKGROUND OF THE INVENTION

The present invention relates to a wire bonding apparatus and a wire bonding method for a semiconductor device, and more particularly, to a wire bonding apparatus and a wire bonding method for a semiconductor device which have been improved to heighten stability of bonding stress between electrodes of a semiconductor chip and inner leads.

The term "wire bonding" indicates connection between chip electrodes and inner leads in package assembling processes of semiconductor devices. For instance, chip electrodes, such as Al electrodes, on an electrode chip and tip end portions of Ag plated inner leads are connected by means of ultrafine wires, such as Au wires, by utilizing thermal energy (temperature atmosphere of 200 to 300° C.) and ultrasonic energy; Au—Al alloys are formed by fusing Au balls at tip end portions of the Au wires with the Al electrodes and Au—Ag alloys are formed by fusing the Ag plated portions of the tip end portions of the inner leads with the Au wires.

FIG. 14 is a plan view of a wire bonding apparatus for a conventional semiconductor device and an arrangement similar to this is disclosed in Japanese Unexamined Patent Publication No. 326609/1993. FIG. 15 is a sectional view seen from the line XV—XV as indicated by the arrow in FIG. 14. In FIG. 14 and FIG. 15, a heat block 11 serves as a jig which is fitted between a heat block main body (not shown) and a lead frame 50 when performing wire bonding, and a lead frame forcing mold 13 is a jig for pressing the lead frame 50 from above to clamp the lead frame to the heat block 11.

The lead frame 50 is so arranged that a die pad 2, a hanging lead 8, a tie bar 9 and a frame 10 are successively formed. The hanging bar 8 is bent at portions proximate to four corner portions of the die pad 2 at which they are in successive communication and the die pad 2 is provided on a plane lower than a place on which the inner lead 4, tie bar 9 and frame 10 are provided (hereinafter, the die pad which is provided on a lower plane is referred to as a sunked die pad). The semiconductor chip 1 is joined to the die pad 2 through an adhesive 3.

The heat block 11 is so arranged that a die pad mounting portion 11a on which the die pad 2 is mounted is in the same plane as that of an inner lead mounting portion 11b onto which the inner leads 4 are mounted. The die pad mounting portion 11a is formed with vacuum suction holes 11c for closely adhering the die pad 2 thereby through vacuum suction. A square concave portion 11d is provided between the die pad mounting portion 11a and the inner lead mounting portion 11b so that close adhesion between the die pad 2 and the die pad mounting portion 11a is not hindered even when the handing lead 8 is deformed to extend below of the surface of the die pad mounting portion 11a upon adhesion of the die pad 2 to the die pad mounting portion 11a through vacuum suction. At four corner portions of the concave portion 11d, there are further formed grooves (not shown) which extend outward of the four corner portions so that the hanging lead 8 will not interfere with mounting of the lead frame 50.

A wire bonding method using a conventional wire bonding apparatus will now be explained. In performing wire bonding, the lead frame 50 is positioned and mounted on the heat block 11 as illustrated in FIG. 15, and after clamping by pinching the lead frame 50 between the frame forcing mold 13 and the heat block 11, the die pad 2 is fixed to the die pad mounting portion 11a through vacuum suction to perform wire bonding thereafter.

The hanging lead 8 which forms a part of the lead frame 50 is provided in the same plane as tip end portions 4a of the inner leads 4 and the sunken die pad portion is in the concave portion 11d formed between the die pad mounting portion 11a and the inner lead mounting portion 11b. A semiconductor chip 1 is mounted on the die pad 2 which is in successive communication with the hanging lead 8 through the adhesive 3 of, for instance, Ag paste.

The die pad mounting portion 11a and the inner lead mounting portion 11b are arranged on the heat block 11 such that they are formed in the same plane. In contrast thereto, in the case of mounting the die pad 2 of the lead frame 50 having a dimension of 0.20 mm as defined by the sunken die pad onto the die pad mounting portion 11a, the die pad 2 is pushed upward by 0.20 mm. Since the lead frame 2 might include manufacturing errors of, for instance, ±0.05 mm, the dimension of the lead frame 50 as defined by the die pad sinking is varied in the range of 0.15 mm to 0.25 mm whereas the die pad 2 is pushed upward by the same amount.

In this condition, the hanging lead 8 and the inner leads 4 are pinched and clamped between the heat block 11 and the lead frame forcing mold 13. The die pad 2 is then fixed onto the die pad mounting portion 11a by means of vacuum suction of a rear surface of the die pad 2 through the vacuum suction hole 11c whereupon the wire bonding process is started.

In the wire bonding process, while heat is applied to electrodes such as Al electrodes, though not shown in the drawings, which are provided at a specified electrode pitch on the semiconductor chip 1 and to tip ends of ultrafine Au wires 6 by means of the heat block 11, pressure welding is performed while applying ultrasonic vibration to the Au balls formed at the tip ends of the Au wires 6 through electric discharge to connect the Al electrodes and the Au wires 6. The Ag plated portions formed at the tip end portions 4a of the inner leads 4 and the ultrafine Au wires 6 are connected by applying heat through the heat block 11 and the frame forcing mold 13 while applying ultrasonic vibration to the ultrafine Au wires 6.

In such a conventional wire bonding apparatus of the above-described arrangement, when detaching the frame forcing mold 13 upon completion of wire bonding, the die pad 2 and the hanging lead 8, which had been forcibly deformed by means of the heat block 11 and the frame forcing mold 13, are released from clamped conditions the moment the frame forcing mold 13 is detached, whereupon the die pad 2 is restored and descends by an amount it had been pushed up and the Au wires 6 are forcibly extended by an amount they were pushed up, so that there is presented a drawback that tensile force is applied to the Au wires 6.

Further, in case manufacturing errors are present in the sunken die pad, there are presented drawbacks that deformation is applied to the hanging lead 8 arranged as to successively communicate with the die pad 2, so that in a following process of resin sealing (not shown), the Au wires 6 are exposed on the surface of the resin when position of the semiconductor chip 1 is varied in an upward direction, and that the die pad 2 is exposed on the surface of the resin in case the position of the semiconductor chip 1 is varied in a downward direction. Such phenomena remarkably occurred in case of packages of, for instance, TSOP (Thin Small Outline Package) type or TQFP (Thin Quad Flat Package) type of especially small thickness, e.g. 1 mm.

A drawback was further presented when the semiconductor chip 1 is uniformly joined to the die pad 2 having a size substantially identical to that of the chip by means of a bonding material. The uniformly joined semiconductor chip 1 and the die pad 2 exhibit deformations such as inclinations or bowing owing to a difference in coefficients of thermal expansion.

The present invention has been made for solving the above-described problems, and it provides a wire bonding apparatus and a wire bonding method for a semiconductor device capable of decreasing an amount of restoration of the hanging lead and decreasing tensile force applied to the wires at the time of detaching the frame forcing mold.

The present invention further provides a wire bonding apparatus and a wire bonding method for a semiconductor device preventing exposure of the Au wires on the surface of resin or exposure of the die pad on the surface of the resin even in the presence of manufacturing errors in the die pad sinking.

The present invention also provides a wire bonding apparatus and a wire bonding method for a semiconductor device capable of restricting deformation such as inclinations or bows owing to difference in coefficients of thermal expansion of the semiconductor chip and the die pad.

SUMMARY OF THE INVENTION

In accordance with a first aspect of the present invention, there is provided a wire bonding apparatus for a semiconductor device comprising a semiconductor chip, and a lead frame having a die pad to which the semiconductor chip is joined and a plurality of inner leads which are aligned along a periphery of the die pad at specified intervals, wherein the apparatus includes a heat block having an inner lead mounting portion for mounting the inner leads, a concave portion provided inward of the inner lead mounting portion and at least one supporting pad for mounting the semiconductor chip.

There is further provided a wire bonding apparatus for a semiconductor device comprising a semiconductor chip, and a lead frame having a die pad to which the semiconductor chip is joined, a plurality of inner leads which are aligned along a periphery of the die pad at specified intervals and a hanging lead in which die pad sinking has been performed proximate to outward of the semiconductor chip for supporting the die pad, wherein the apparatus includes a heat block having an inner lead mounting portion for mounting the inner leads, a concave portion provided inward of the inner lead mounting portion while forming a clearance between portions to which die pad sinking has been performed, and at least one supporting pad for mounting the semiconductor chip provided within the concave portion while forming a difference in elevation with the inner lead mounting portion.

The supporting pad is arranged to have vacuum suction holes for sucking the semiconductor chip.

The apparatus is so arranged that it further includes a lead frame forcing means for pinching and holding the lead frame at regions other than the die pad and tip end portions of the inner leads between the inner lead mounting portion and the lead frame forcing means.

In accordance with a second aspect of the present invention, there is provided a wire bonding method for a semiconductor device comprising a semiconductor chip, and a lead frame having a die pad to which the semiconductor chip is joined and a plurality of inner leads which are aligned along a periphery of the die pad at specified intervals, wherein the method includes the steps of mounting the inner leads on an inner lead mounting portion of a heat block, mounting the semiconductor chip on at least one supporting pad which is provided in a concave portion provided inward of the inner lead mounting portion, and pinching and holding the lead frame at portions other than the die pad and tip end portions of the inner leads between a lead frame forcing means and the inner lead mounting portion.

In a device wherein the lead frame includes a hanging lead in which die pad sinking has been performed proximate to outward of the semiconductor chip for supporting the die pad, the method further includes the steps of arranging a concave portion of the head block such that a clearance is formed between portions of the lead frame to which die pad sinking has been performed, providing the supporting pad such that a difference in elevation is formed between the same and the inner lead mounting portion, and pinching and holding the lead frame by means of the lead frame forcing means at portions other than the die pad and tip end portions of the inner leads.

The supporting pad is arranged to have vacuum suction holes for sucking the semiconductor chip.

DETAILED DESCRIPTION

EMBODIMENT 1

Before explaining the wire bonding apparatus for a semiconductor device according to Embodiment 1 and the method for manufacturing the device, the arrangement of the semiconductor device which is manufactured by using the wire bonding apparatus will first be explained.

Figure 1:
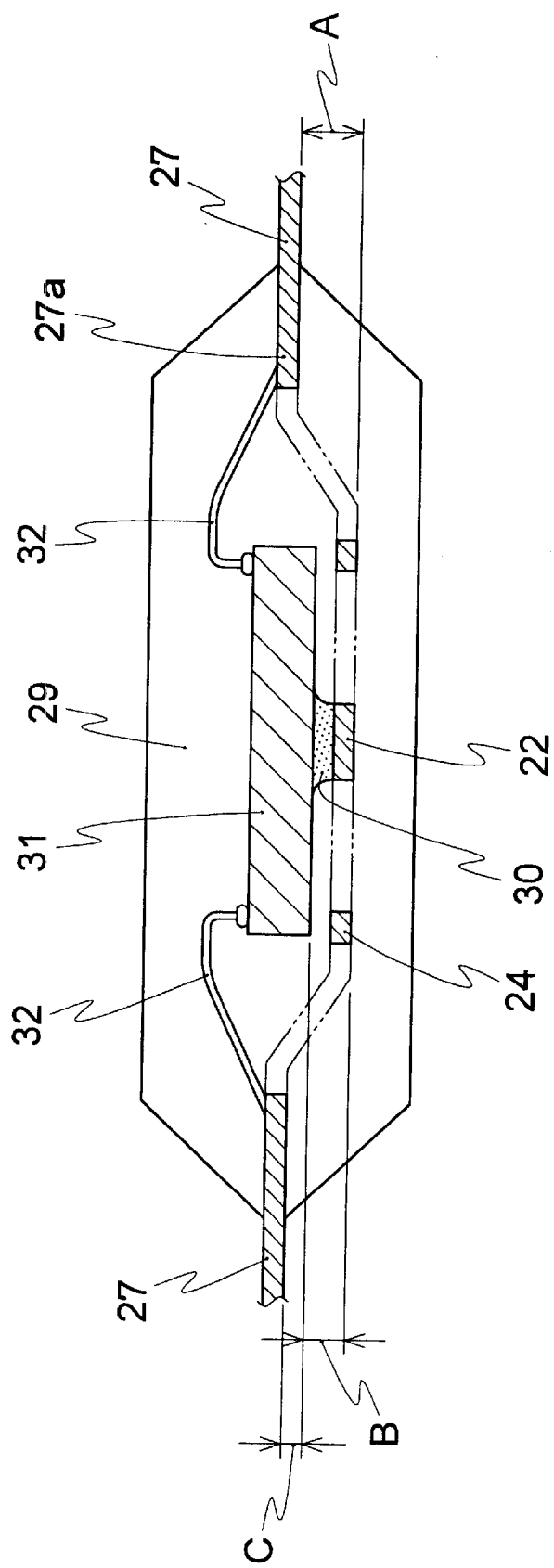
FIG. 1 is a sectional view showing an arrangement of a semiconductor device which is manufactured with the use of a wire bonding apparatus according to Embodiment 1.

FIG. 1 is a sectional view showing an arrangement of a semiconductor device which is manufactured by using the wire bonding apparatus according to Embodiment 1. In FIG. 1, a semiconductor chip 31 is joined to a die pad 22 by means of a bonding material 30 comprising Ag paste, adhesive tape or the like, and is arranged to be lower by step C than tip end portions 27a of a plurality of inner leads 27 which are aligned along a periphery of the die pad 22 at specified intervals. A hanging lead reinforcement 24 and a first hanging lead 23 (refer to FIG. 2(a)) which are provided on the same plane as the die pad 22 are formed such that a clearance is formed between these and a lower surface of the semiconductor chip 31 and such that they are disposed lower by dimension B. The tip end portions 27a and the semiconductor chip 31 are electrically connected through ultrafine wires 32 of conductive metal and are thereafter covered with sealing resin 29.

The semiconductor device is assembled such that a relationship of A=B+C is satisfied among step A (dimension owing to die pad sinking) from a lower surface of the inner leads 27 to a lower surface of the die pad 22, dimension B from the lower surface of the semiconductor chip 31 to the lower surface of the die pad 22, and dimension C from the lower surface of the inner leads 27 to the lower surface of the semiconductor chip, and it is required to accurately secure dimension C when being sealed through the sealing resin 29.

Figure 2A:
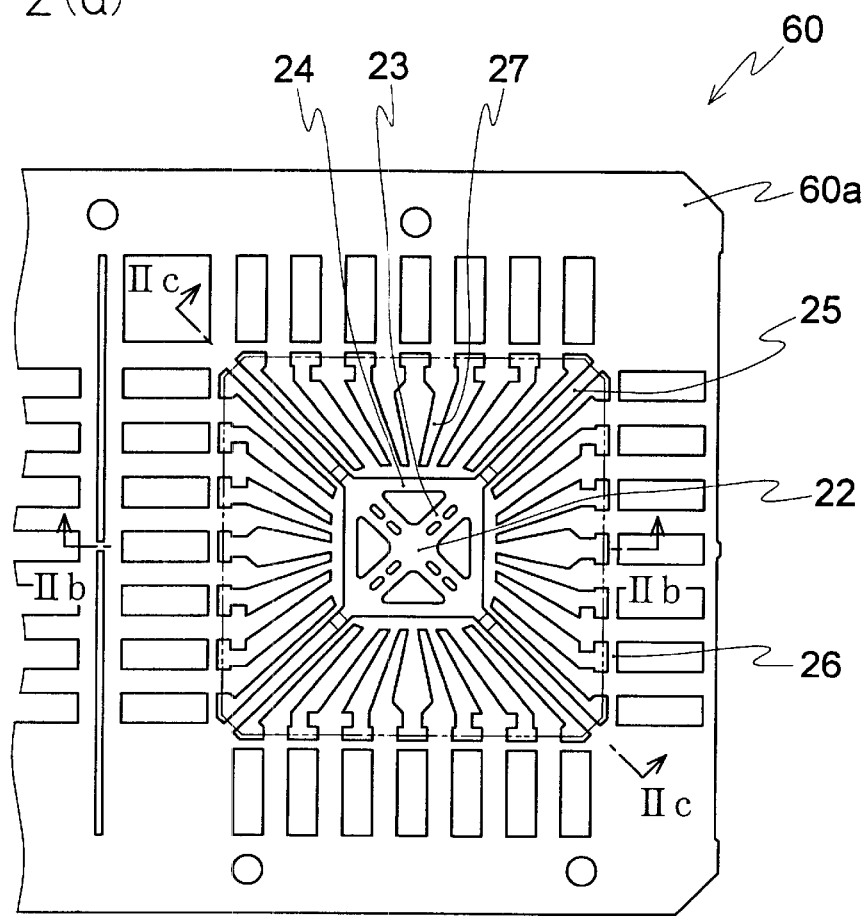
FIG. 2(a) is a plan view of a lead frame used for manufacturing the semiconductor device illustrated in FIG. 1.
Figure 2B:
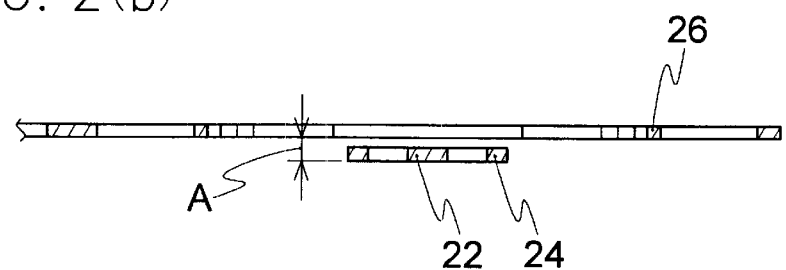
FIG. 2(b) is a sectional view seen from the line IIb—IIb as indicated by the arrow in FIG. 2(a)
Figure 2C:
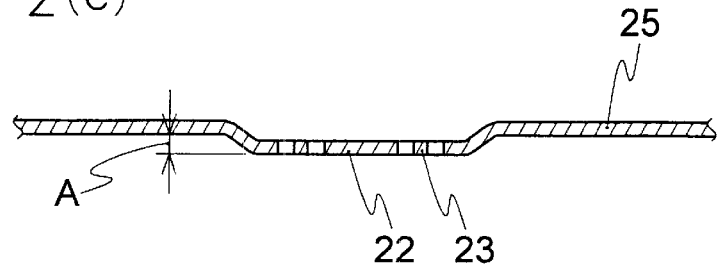
FIG. 2(c) is a sectional view seen from the line IIc—IIc as indicated by the arrow in FIG. 2(a)

FIG. 2(a) is a plan view of a lead frame which is used for manufacturing the semiconductor device illustrated in FIG. 1, FIG. 2(b) is a sectional view seen from the line IIb—IIb as indicated by the arrow in FIG. 2(a), and FIG. 2(c) is a sectional view seen from the line IIc—IIc as indicated by the arrow in FIG. 2(a). In FIG. 2(a), FIG. 2(b) and FIG. 2(c), a lead frame 60 is so arranged that the die pad 22, the first hanging lead 23, the hanging lead reinforcement 24, a second hanging lead 25, and a tie bar 26 provided for preventing leakage of the sealing resin 29 are formed in succession with a frame 60a.

The second hanging lead 25 is bent at portions proximate to outward of the semiconductor chip 31, that is, proximate to portions at which it successively communicates with the hanging lead reinforcement 24, and the die pad 22, first hanging lead 23 and hanging lead reinforcement 24 are formed on a plane which is lower than a plane defined by the second hanging lead 25, inner leads 27, tie bar 26 and frame 60a by step A.

Figure 3:
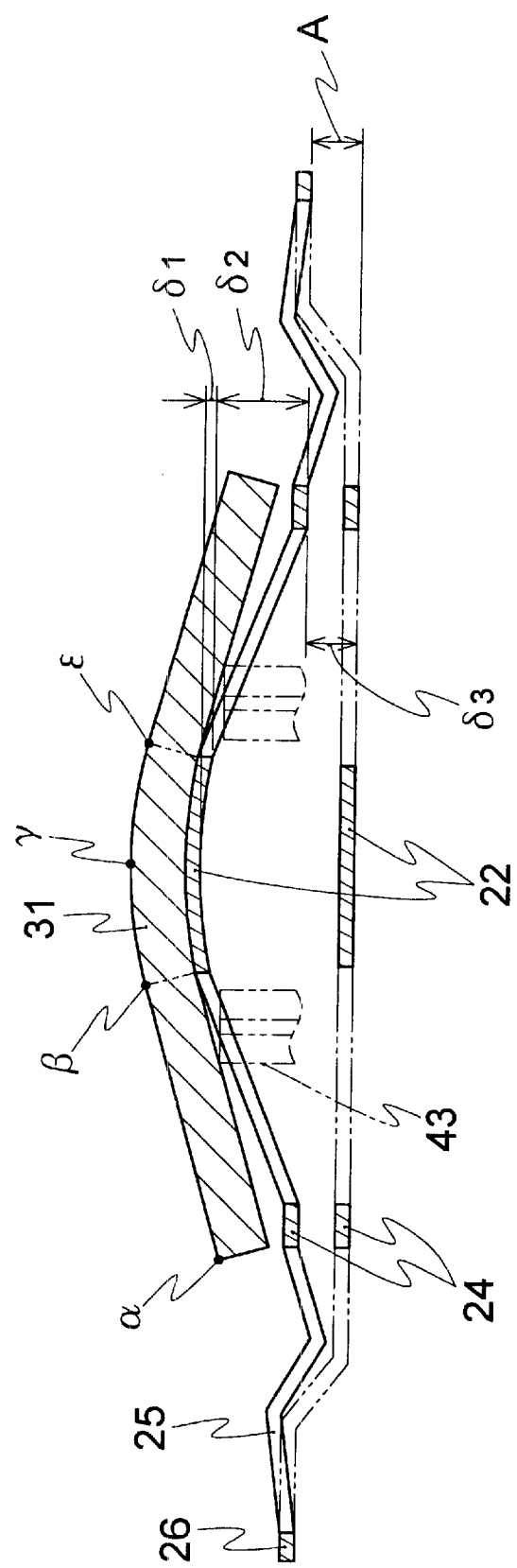
FIG. 3 is an explanatory view showing a section of thermal deformation in case a die pad is joined to a semiconductor chip by means of a bonding material which is not shown in FIG. 3.

FIG. 3 is an explanatory view showing a section of thermal deformation owing to a difference in coefficients of thermal expansion in case the die pad 22 is joined to the semiconductor chip 31 by means of the bonding material 30. The semiconductor chip 31 and the die pad 22 are bent between joined portions β-γ-ε to exhibit displacement amount δ1 at curvatures which are determined by respective physical properties and dimensions (the curvatures, displacement amounts and displacement angles might be obtained by calculation by using the finite element method or the like). The portion α-β between the semiconductor chip 31 and the die pad 22 which is not joined is extended linearly in a direction of a displacement angle formed at joined end β with the die pad 22. Portions of the semiconductor chip 31 which form straight lines at exterior regions of the die pad 22 are supported by supporting pads 43. Since the first hanging lead 23, hanging lead reinforcement 24 and second hanging lead 25 are successively arranged with respect to the die pad 22, they are deformed as indicated by δ2, δ3 in accordance with thermal deformation of the die pad.

Figure 4:
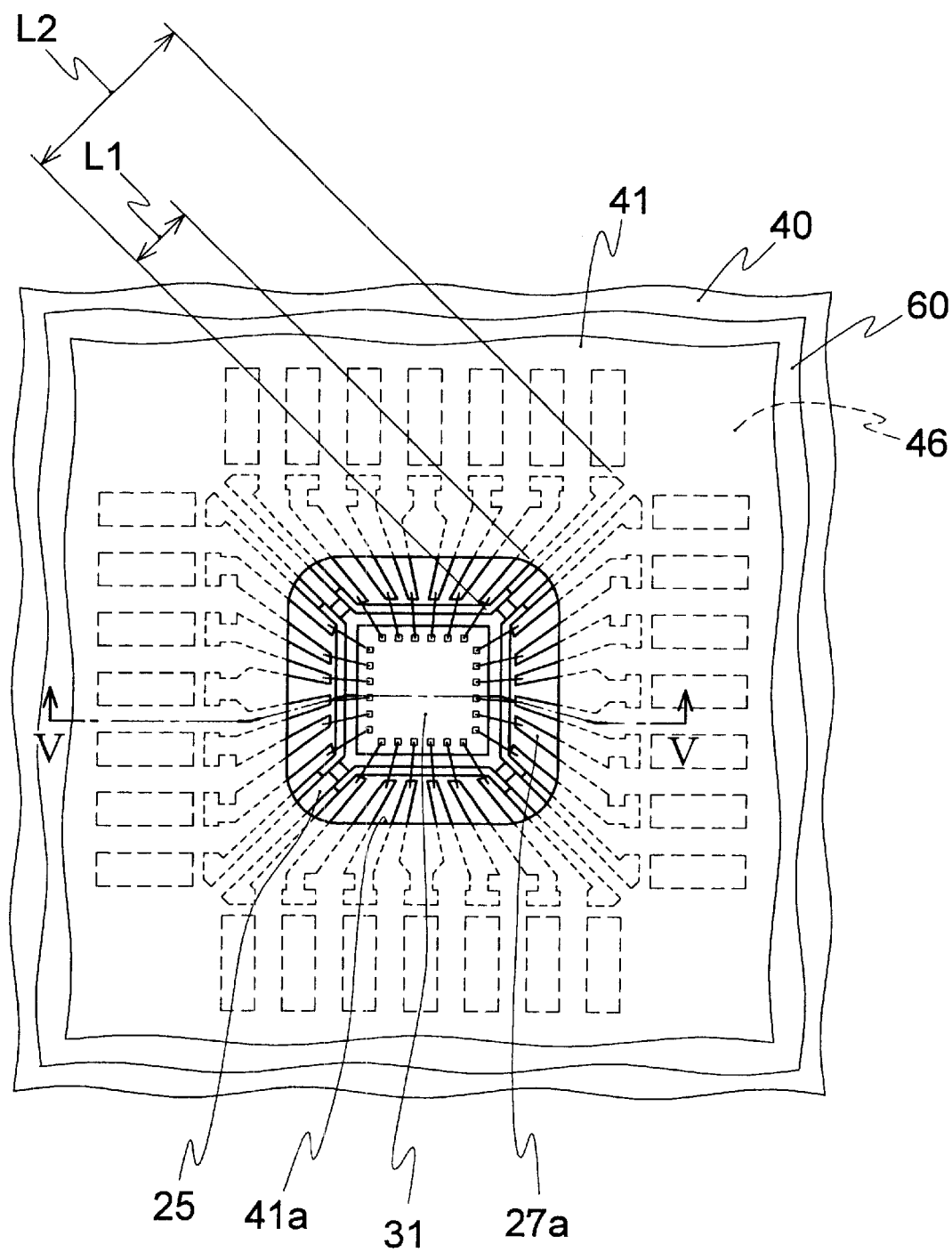
FIG. 4 is a plan view showing an arrangement of the wire bonding apparatus of the semiconductor device according to Embodiment 1.
Figure 5:
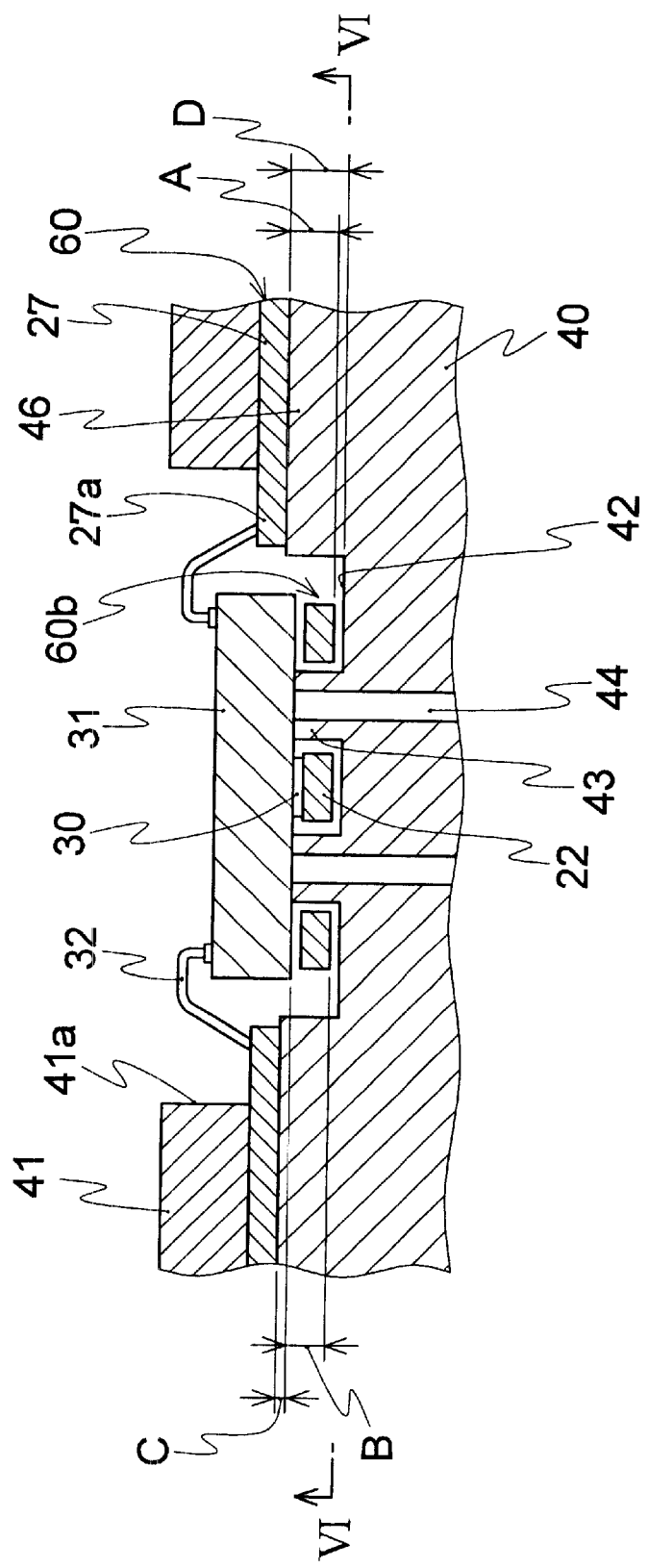
FIG. 5 is a sectional view seen from the line V—V as indicated by the arrow in FIG. 4.
Figure 6:
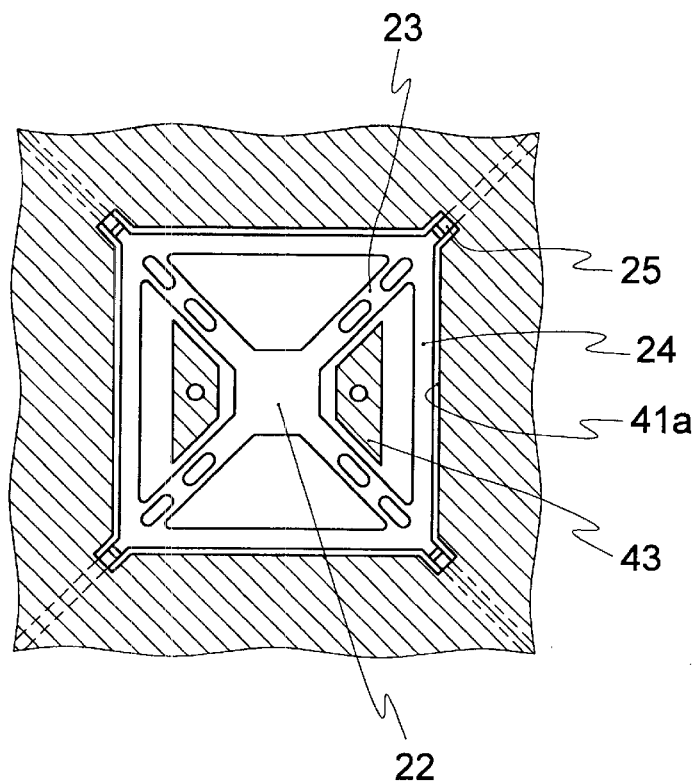
FIG. 6 is a sectional view seen from the line VI—VI as indicated by the arrow in FIG. 5.
Figure 7:
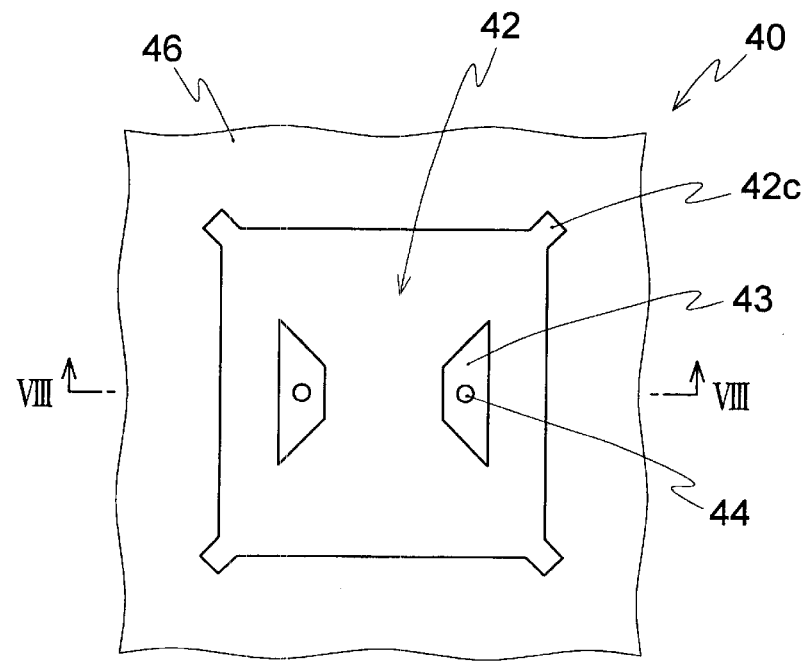
FIG. 7 is a plan view showing a main portion of FIG. 5.
Figure 8:
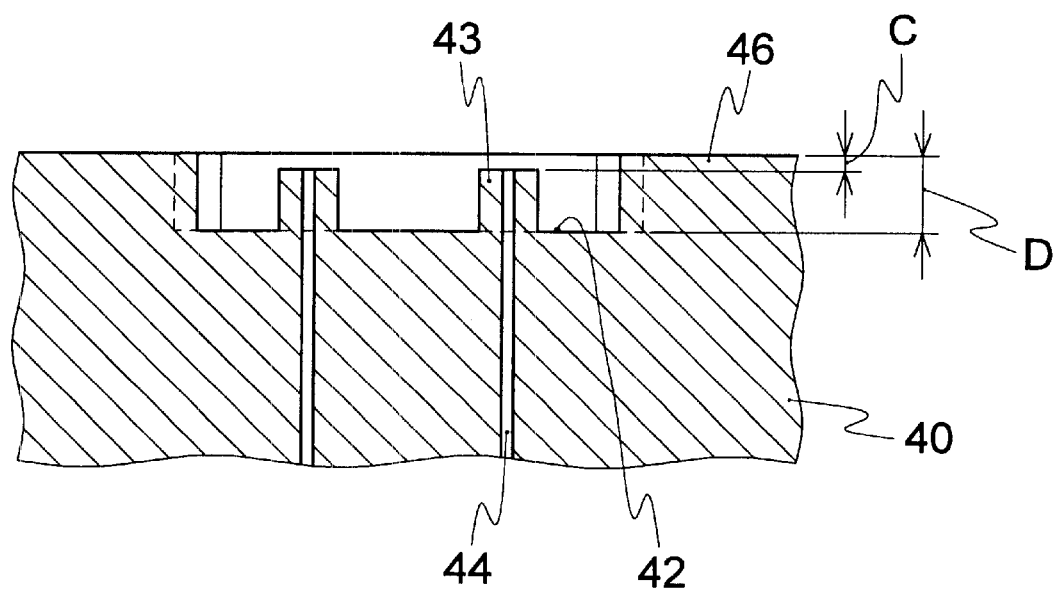
FIG. 8 is a sectional view seen from the line VIII—VIII as indicated by the arrow in FIG. 7.

The arrangement of the wire bonding apparatus for a semiconductor device according to Embodiment 1 of the present invention will now be explained. FIG. 4 is a plan view showing an arrangement of the wire bonding apparatus of the semiconductor device, FIG. 5 is a sectional view seen from the line V—V as indicated by the arrow in FIG. 4. FIG. 6 is a sectional view seen from the line VI—VI as indicated by the arrow in FIG. 5. FIG. 7 is a plan view showing a main portion of FIG. 5, and FIG. 8 is a sectional view seen from the line VIII—VIII as indicated by the arrow in FIG. 7.

In FIGS. 4 to 8, there are respectively shown the wire bonding apparatus for a semiconductor device comprising a semiconductor chip 31; and a lead frame 60 including a die pad 22 to which the semiconductor chip 31 is joined, a plurality of inner leads 27 which are aligned along a periphery of the die pad 22 at specified intervals, and a hanging lead for supporting the die pad 22 of which die pad sinking has been performed proximate to outward of the semiconductor chip 31.

In the wire bonding apparatus for a semiconductor device, a heat block 40 is provided with an inner lead mounting portion 46 for mounting the inner leads 27. A concave portion 42 is formed inward of the inner lead mounting portion 46 by forming step D with respect to the inner lead mounting portion 46 such that a clearance is formed between the same and portion 60b of the lead frame 60 to which die pad sinking has been performed, in case the lower surface of the semiconductor chip 31 is closely fitted to the supporting pad 43 through vacuum suction as will be described later.

The supporting pads 43 for mounting the semiconductor chip 31 are formed in the concave portion 42 to form a difference of elevation C with respect to the inner lead mounting portion 46 and the supporting pads 43 are further formed with vacuum suction holes 44. At four corner portions of the concave portion 42, grooves 42c are provided which partly extend further outward in the direction of the second hanging lead 25 such that the hanging lead reinforcement 24 and the bend portions of the second hanging lead 25 forming the die pad sinking do not come in contact with the inner lead mounting portion 46 in case the lead frame 60 is mounted on the inner lead mounting portion 46.

With this arrangement, portions to which die pad sinking has been performed do not directly come in contact with the concave portion 42 also in the presence of manufacturing errors in the die pad sinking, there can be prevented that force accompanying the contact is applied to the inner leads 27 by means of the die pad 22, first hanging lead 23, hanging lead reinforcement 24, second hanging lead 25, and tie bar 26. It is further possible to mount a semiconductor chip 31 with a small deformation on the supporting pad 43 and to mount the inner leads 27 on the inner lead mounting portion 46. With this arrangement, influences of deformations in the die pad sinking or deformations such as inclinations or bowing which are generated owing to a difference in coefficients of thermal expansion of the semiconductor chip 31 and the die pad 22 at the time of performing wire bonding or after the wire bonding are restricted.

As illustrated in FIG. 5, the semiconductor chip 31 is abutting the supporting pads 43 of the heat block 40. The lead frame 60 mounting thereon the semiconductor chip 31 is mounted on the inner lead mounting portion 46 and is further pinched and held between the lead frame forcing mold 41 and the inner lead mounting portion 46. By being clamped by means of the lead frame forcing mold 41, a total of the displacement amount δ1 of the hanging lead as obtained by means of e.g. finite element method and the sum of the thickness dimension of the die pad 22 and the thickness dimension of the bonding material 30 is represented as dimension B, and a dimension obtained by subtracting this value B from the step A owing to the die pad sinking is represented as C. In case the dimension of the semiconductor chip 31 is small and the value of the displacement amount δ1 is small in contrast to the variation amount of the step A to be at an ignorable level, it is also possible to set the sum of the thickness dimension of the die pad 22 and the thickness dimension of the bonding material 30 as B.

As illustrated in FIG. 4, the lead frame forcing mold 41 is provided with an aperture 41a to cover regions of the lead frame 60 other than the die pad 22, tip end portions 27a of the inner leads and portions to which die pad sinking has been performed, and pinches and holds the inner frame 60 at these regions between the mold and the inner lead mounting portion 46. Since the fixing force of the second hanging lead 25 becomes larger the shorter the length L1 of the second hanging lead 25 becomes, the four corners of the aperture 41a are arranged, for instance, to be circular.

The wire bonding method for a semiconductor device will now be explained. In case the semiconductor chip 31 is joined to the die pad 22 of the lead frame 60 by means of the bonding material 30 and the same is positioned and mounted on the inner lead mounting portion 46 as illustrated in FIG. 5, mounting is performed with the lower surface of the semiconductor chip 31 abutting the supporting pad 43. In this condition, the semiconductor chip 31 is fixed by vacuum suction through the vacuum suction holes 44. The die pad 22, first hanging lead 23, hanging lead reinforcement 24 and portions of the second hanging lead 25 at which the die pad sinking is formed are arranged with a clearance being formed between these and the concave portion 42.

Thereafter, the lead frame forcing mold 41 including the aperture 41a is positioned and mounted on the lead frame 60 for pinching and holding the lead frame 60 between the mold and the lead frame mounting portion 46. Then, e.g., the Al electrodes, which are formed on the semiconductor chip 31 and tip end portions 27a of the inner leads corresponding to these electrodes, are connected through wires 32 comprising ultrafine wires such as gold wires, Al wires and Cu wires. While applying thermal energy to the tip ends of the wires 32 by means of the heat block 40, pressure welding is performed while applying ultrasonic energy to gold balls formed at either of the tip ends of the wires 32 through electric discharge, and tip end portions of the gold balls are fused and joined to the Al electrodes. Joint portions of the tip end portions 27a of the inner leads are Ag plated, and while applying thermal energy to these by means of the heat block 40, pressure welding is performed while applying ultrasonic energy to the other ends of the wires 32 for fusing and joining the wires 32 with Ag.

Figure 9:
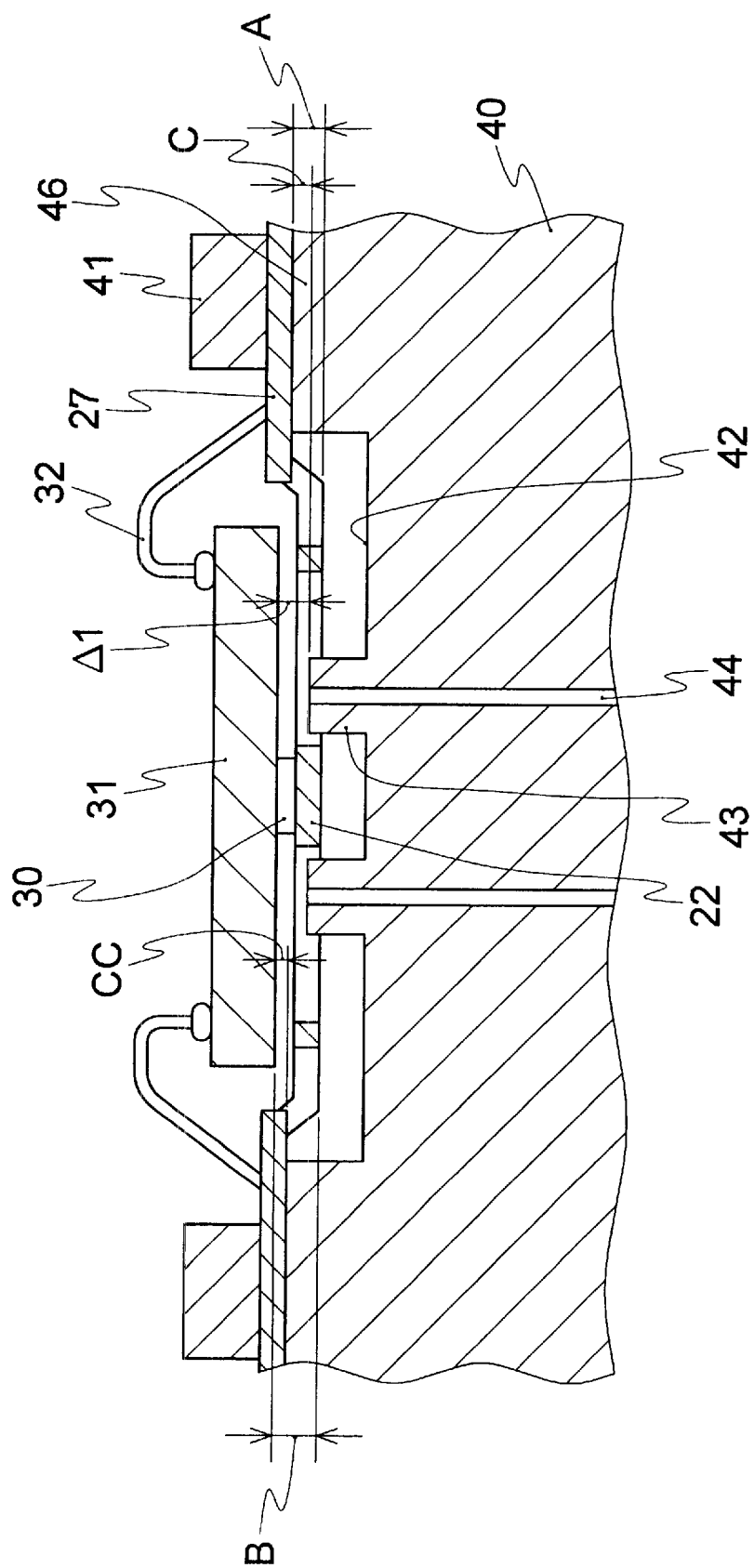
FIG. 9 is a sectional view in case a lead frame is mounted of which step A owing to die pad sinking is manufactured to assume a least depth.

A method for wire bonding in a semiconductor device employing a lead frame including manufacturing errors will now be explained. FIG. 9 is a sectional view in case a lead frame is mounted of which step A owing to die pad sinking is manufactured to assume a least depth. On the other hand, FIG. 10 is a sectional view in case a lead frame is mounted of which step A owing to die pad sinking is manufactured to assume a deepest depth.

In case of a lead frame in which step A is manufactured to assume a least depth, and the inner leads 27 are mounted by abutting against the inner lead mounting portion 46 as illustrated in FIG. 9, a clearance Δ1 is formed between the semiconductor chip 31 and the supporting pad 43. In case the value CC obtained by subtracting the sum B of the plate thickness of the die pad 22 and the thickness of the bonding material 30 from the step A becomes negative with respect to the difference of elevation C between the inner lead mounting portion 46 and the supporting pad 43 (that is, B is larger than A), Δ1=|CC−C| is satisfied, and clearanceΔ1 is formed between the semiconductor chip 31 and the upper surface of the supporting pad 43. In this case, A=B+CC is satisfied (wherein CC becomes a negative value). Since this clearanceΔ1 cannot be eliminated even by pressing the inner leads 27 by means of the lead frame forcing mold 41, fixing is performed by vacuum sucking the lower surface of the semiconductor chip 31 through the vacuum suction hole 44.

Figure 10:
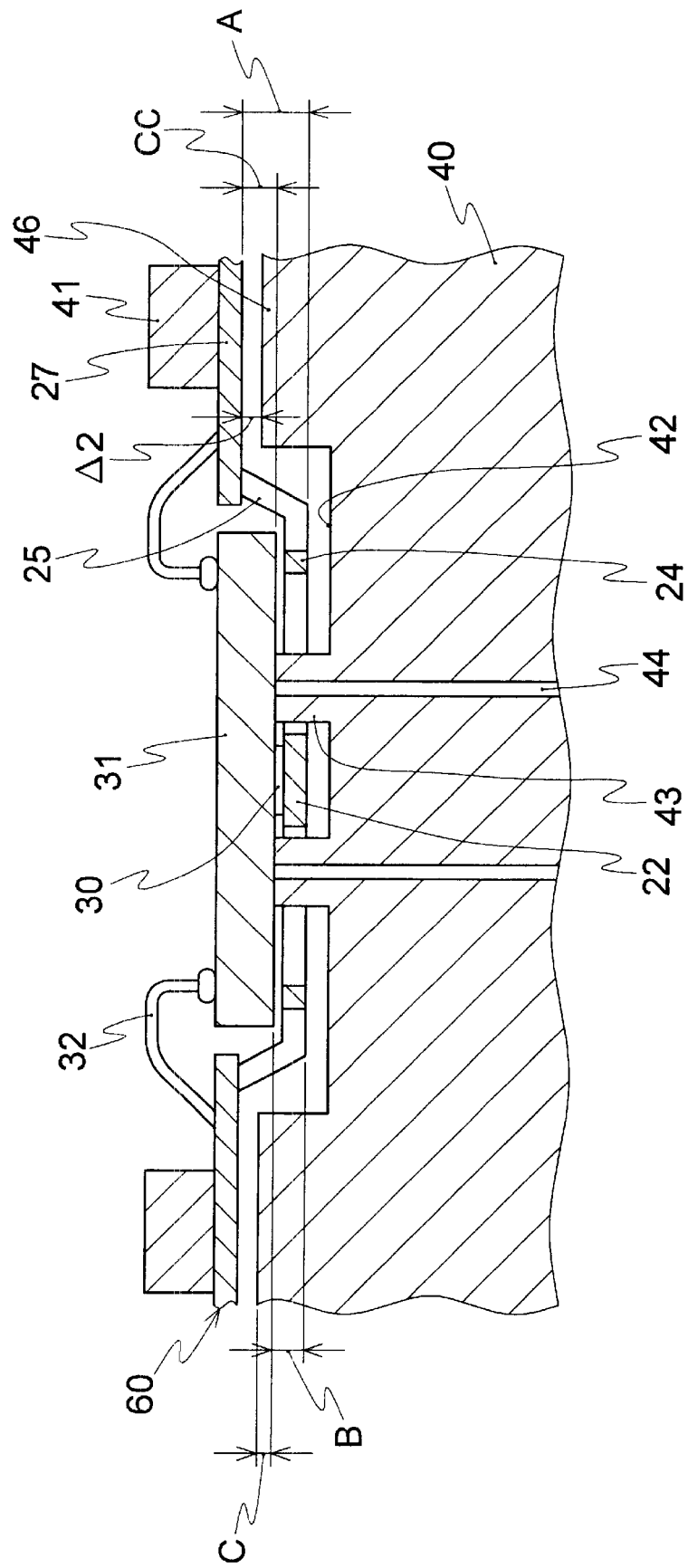
FIG. 10 is a sectional view in case a lead frame is mounted of which step A owing to die pad sinking is manufactured to assume a deepest depth.

Next, in case of a lead frame in which step A is manufactured to assume a deepest depth, and the inner leads 27 are mounted by abutting against the inner lead mounting portion 46 as illustrated in FIG. 10, the semiconductor chip 31 abuts against the supporting pad 43. Since the value CC obtained by subtracting the sum B of the plate thickness of the die pad 22 and the thickness of the bonding material 30 from the step A is larger than the difference of elevation C between the inner lead mounting portion 46 and the supporting pad 43, a clearance Δ2 represented as Δ2=|CC−C| is generated between the inner leads 27 and the inner lead mounting portion 46.

This clearance Δ2 might be forcibly displaced by mounting the lead frame forcing mold 41 on the inner leads 27 and by pinching and holding regions of the lead frame 60 other than the die pad 22, tip end portions 27a of the inner leads and portions to which die pad sinking has been performed between the mold and the inner lead mounting portion 46. In this case, the semiconductor chip 31 is pressed against the supporting pad 43 by means of the bonding material 30, die pad 22, first hanging lead 23, hanging lead reinforcement 24 and second hanging lead 25 to add abutting force. Fixing force might be further ensured by vacuum clamping the lower surface of the semiconductor chip 31 through the vacuum suction holes 44. In this case, A=B+CC is satisfied (wherein CC becomes a negative value).

In this manner, according to Embodiment 1 of the present invention, the die pad 22, first hanging lead 23, hanging lead reinforcement 24 and second hanging lead 25 including deformations owing to difference in coefficient of thermal expansion and to the die pad sinking are arranged with a clearance formed between these and the concave portion 42 formed in the heat block 40, and the lead frame 60 is fixed by the lead frame forcing mold 41 at regions other than the die pad 22, tip end portions 27a of the inner leads and portions to which die pad sinking has been performed. That is, wire bonding is performed in a condition in which no force is applied to deformed portions, and in which the lower surface of the semiconductor chip 31 with a little deformation is abutted at the supporting pad 43 while the lower surface of the inner leads 27 is abutted at the inner lead mounting portion 46 for maintaining a positional relationship between the semiconductor chip 31 and the inner leads 27 constant.

When detaching the lead frame forcing mold 41 upon completion of wire bonding, the length of the hanging lead when fixing with the lead frame forcing mold 41 is L1 while the effective length of the hanging lead after detaching the mold 41 is L2, as illustrated in FIG. 4. Therefore, the influence of restoration of the hanging lead on the wires 32 can be decreased to $(L1/L2)^3$ and it is further possible to decrease tensile force of the wires 32. The reason why the influence of restoration of the hanging lead on the wires 32 can be decreased to $(L1/L2)^3$ is that the fixing force F of the hanging lead can be obtained by $F=2\times E\times W\times(T/L)^3\times\delta$ wherein an elastic coefficient of the hanging lead is given as E, its width as W, its thickness as T, its length as L and the amount of lifting of the die pad when it is abutted against the heat block as $\delta$.

While Embodiment 1 has been represented as to be an arrangement in which the supporting pad 43 is formed at two portions, the same action and effects as described above might be exhibited irrespective of the number of supporting pads as long as at least one supporting pad 43 is provided so as to maintain the semiconductor chip 31 in a horizontal condition.

It should be noted that the same action and effects as described above might be exhibited though the hanging lead is not composed of the first hanging lead 23, hanging lead reinforcement 24 and second hanging lead 25 but is a single hanging lead as explained above in connection with the prior art.

Embodiment 2

Figure 11:
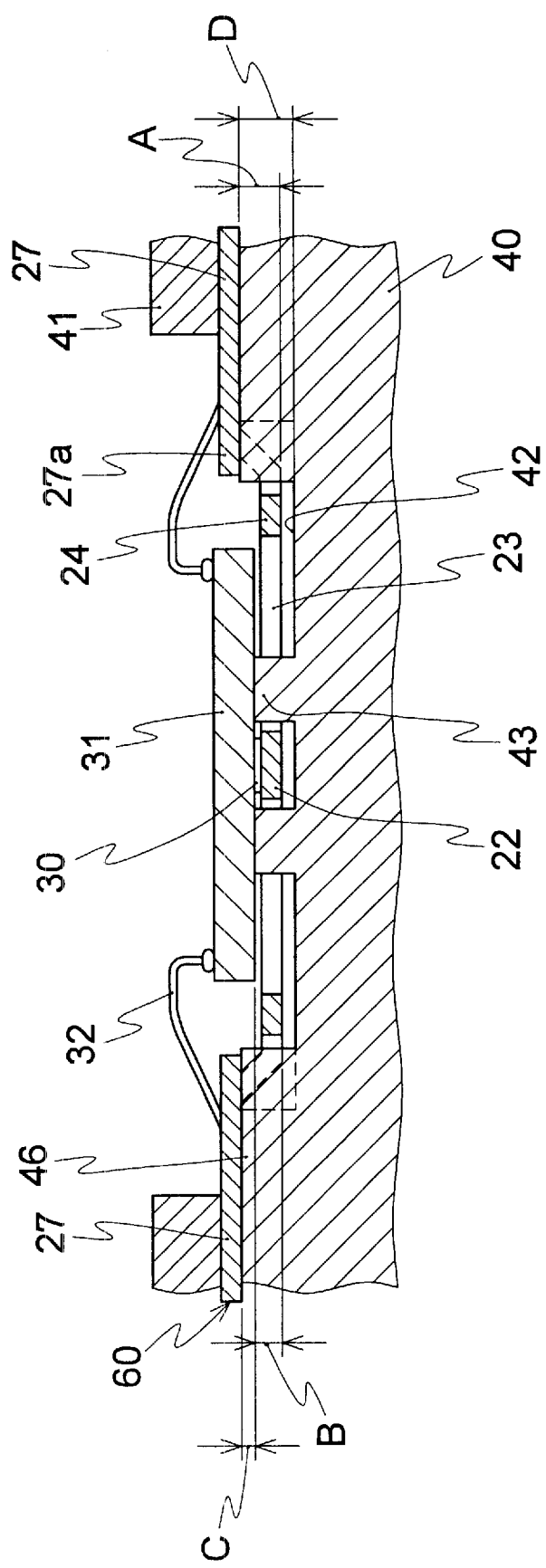
FIG. 11 is a sectional view showing an arrangement of a wire bonding apparatus of a semiconductor device according to Embodiment 2.
Figure 12:
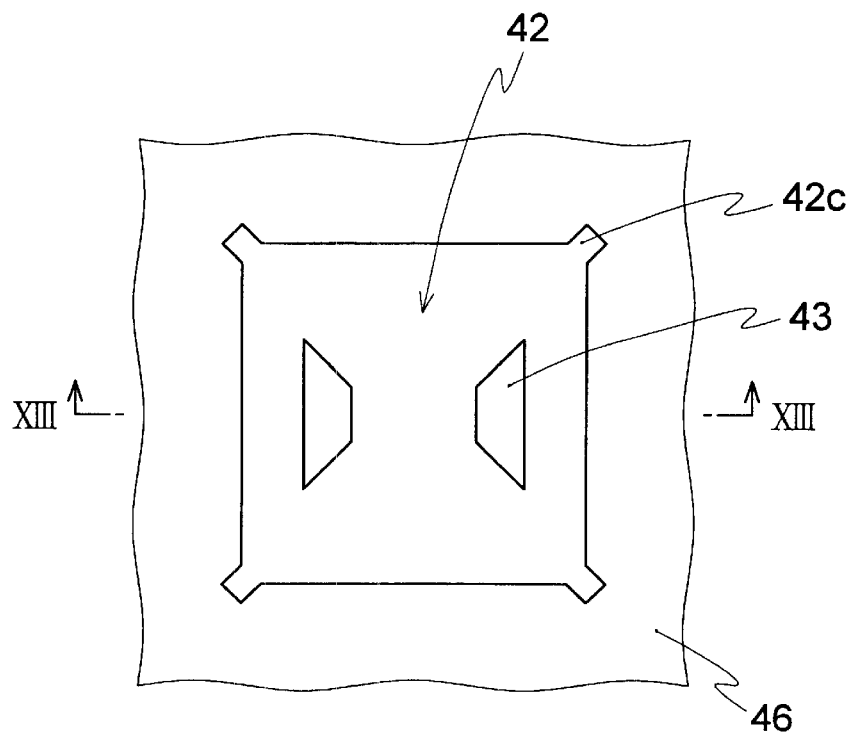
FIG. 12 is a plan view showing a main portion of FIG. 11.
Figure 13:
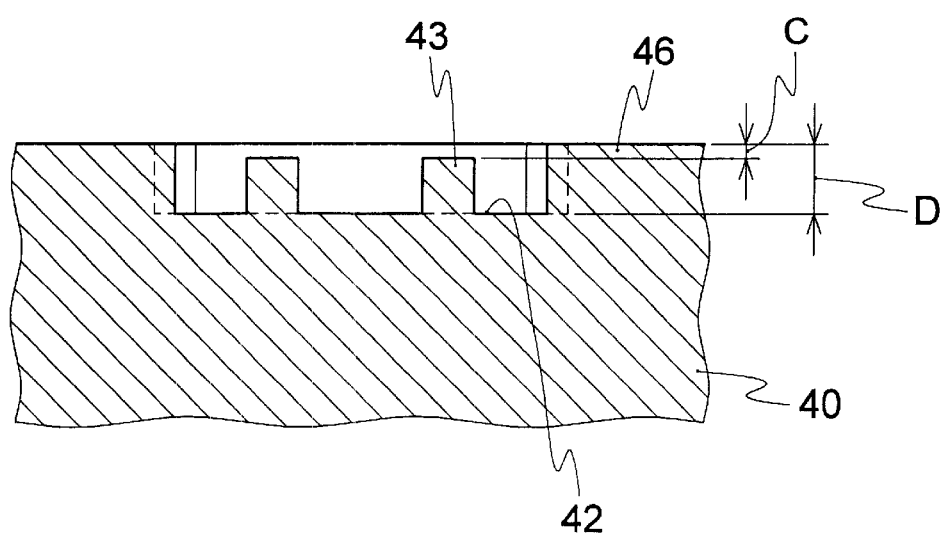
FIG. 13 is a sectional view seen from the line XIII—XIII as indicated by the arrow in FIG. 12.
Figure 14:
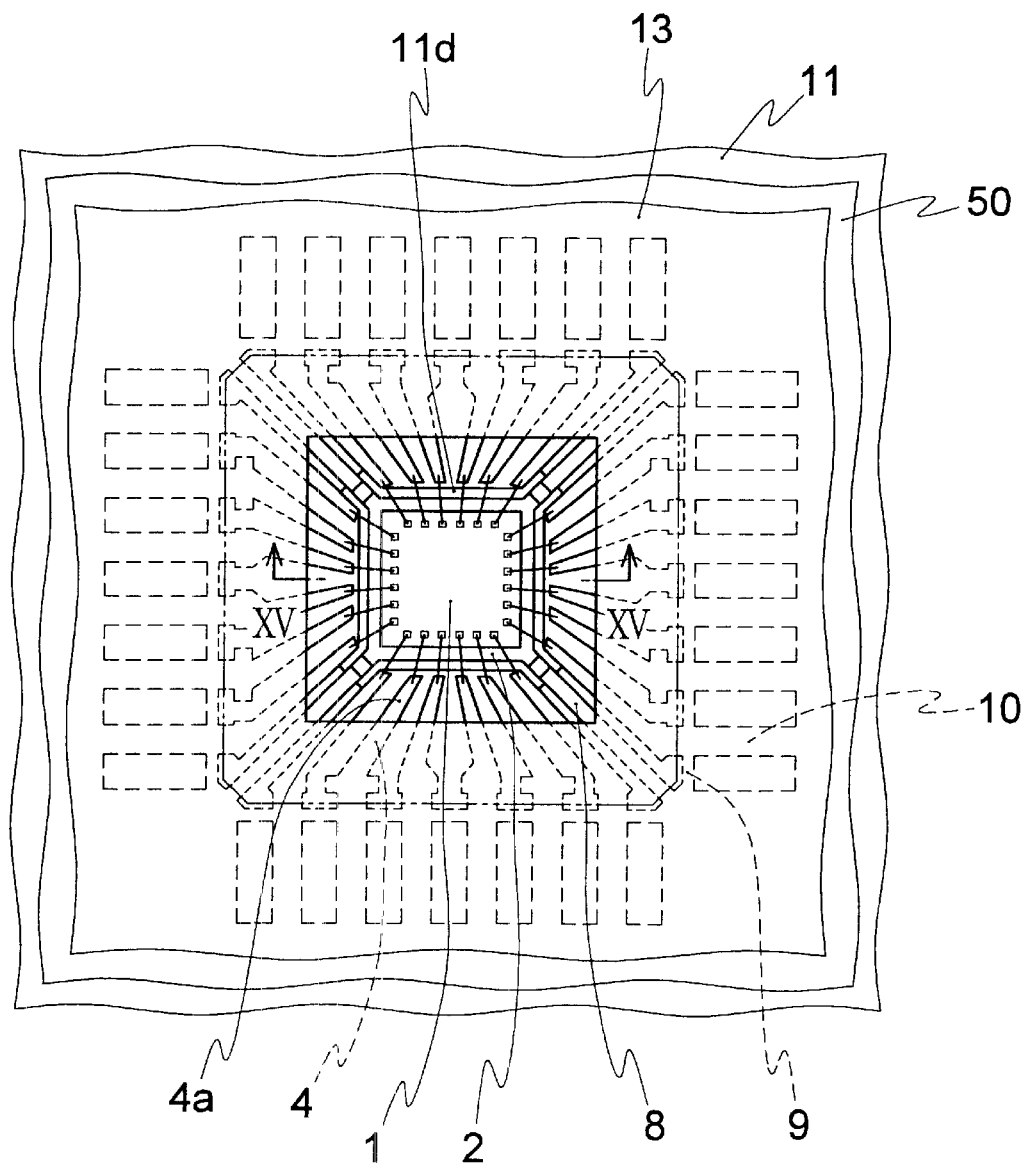
FIG. 14 is a plan view of a wire bonding apparatus of a conventional semiconductor device.
Figure 15:
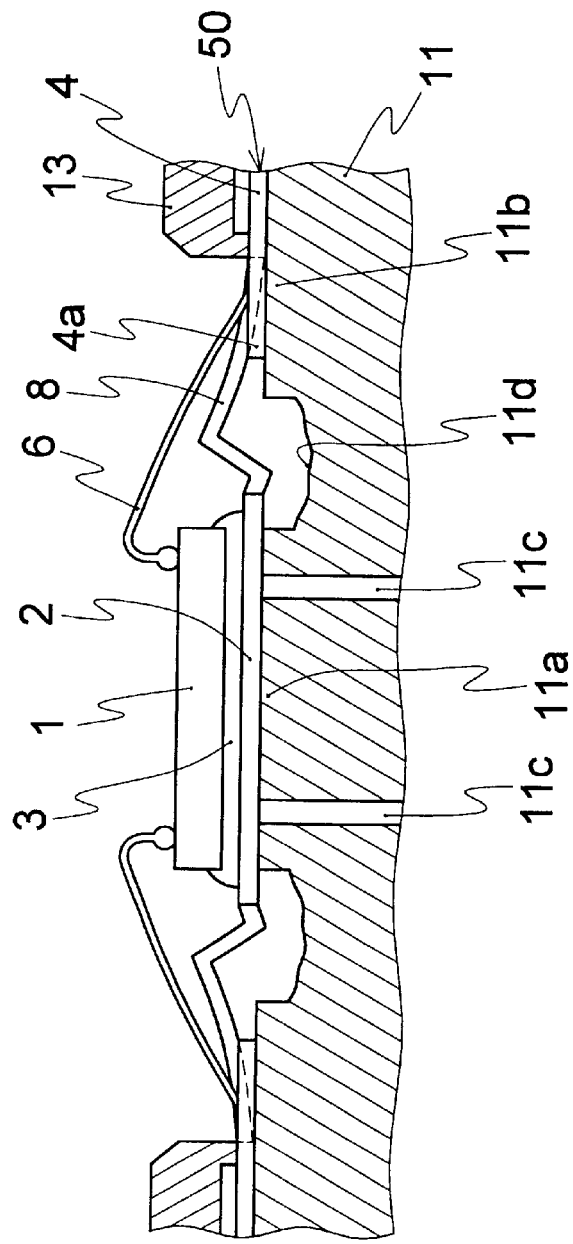
FIG. 15 is a sectional view seen from the line XV—XV as indicated by the arrow in FIG. 14.

FIG. 11 is a sectional view showing an arrangement of a wire bonding apparatus of a semiconductor device according to Embodiment 2 of the present invention. FIG. 12 is a plan view showing a main portion of FIG. 11, and FIG. 13 is a sectional view seen from the line XIII—XIII as indicated by the arrow in FIG. 12. Among reference numerals illustrated in Embodiment 2, identical numerals as those illustrated in Embodiment 1 indicate identical or similar portions and explanations thereof will be omitted.

Embodiment 2 differs from Embodiment 1 in that while the supporting pad 43 provided at concave portion 42 includes vacuum suction holes 44 for vacuum clamping of semiconductor chip 31 in Embodiment 1, the vacuum suction holes 44 are omitted in Embodiment 2.

As illustrated in FIGS. 11 to 13, the semiconductor chip 31 abuts against the supporting pad 43 of heat block 40. Lead frame 60 mounting the semiconductor chip 31 is mounted on the inner lead mounting portion 46 and is further pinched and held between the lead frame forcing mold 41 and the inner lead mounting portion 46. Supporting pads 43 for mounting the semiconductor chip 31 are provided at the concave portion 42 to assume difference of elevation C with respect to the inner lead mounting portion 46. The difference of elevation C is obtained by subtracting the sum B of a maximum plate thickness of die pad 22 and a maximum thickness of bonding material 30 from the step A. Since this method is applied to a semiconductor device mounting small-dimensioned semiconductor chips exhibiting small deformations, C is determined with deformations being omitted, while C might also be determined in consideration of deformation. Step D is set to be larger than step A.

The wire bonding method in a semiconductor device according to Embodiment will now be explained. The semiconductor chip 31 is joined to the die pad 22 of the lead frame 60 by means of the bonding material 30 and the lead frame 60 is positioned and mounted on the inner lead mounting portion 46, similarly to Embodiment 1. The die pad 22, hanging lead reinforcement 24, first hanging lead 23, and portions of second hanging lead 25 at which the pad sinking is formed are arranged with a clearance being formed between these and the concave portion 42. The semiconductor chip 31 is closely touching to the supporting pads 43 and the inner leads 27 are closely touching to the inner lead mounting portion 46. Thereafter, the lead frame forcing mold 41 is positioned, the lead frame 60 is pinched and held between the mold and the lead frame mounting portion 46 and wires 32 are joined between e.g. Al electrodes formed on the semiconductor chip 31 and tip end portions 27a of inner leads corresponding to these electrodes.

It is possible to omit the vacuum suction holes in Embodiment 2 of the present invention by setting the difference of elevation C between the supporting pad 43 and the inner lead mounting portion 46 to a suitable value, and a method thereof will now be explained.

The difference of elevation C between the supporting pad 43 and the inner lead mounting portion 46 is determined with step A of the lead frame 60 being a reference. Embodiment 2 presents a case in which the step A of the lead frame is deep, and is thus equal to the case of FIG. 10 of Embodiment 1. In case the lead frame 60 is mounted on the inner lead mounting portion 46, the lower surface of the semiconductor chip 31 abuts against the supporting pad 43 to assume a condition in which clearance $\Delta 2$ is formed between the inner leads 27 and the inner lead mounting surface 46. In Embodiment 2, this value $\Delta 2$ is set to indicate a value which is identical to the width of variations in step A.

Thereafter, the inner leads 27 are pinched and held by means of the lead frame forcing mold 41 between the same and the inner lead mounting surface 46 until the clearance$\Delta 2$ is eliminated to fix the semiconductor chip 31. Then, in case the lead frame forcing mold 41 is detached upon completion of wire bonding, the restriction of the lead frame is released such that the first hanging lead 23, hanging lead reinforcement 24 and second hanging lead 25 are restored to conditions in which the clearance $\Delta 2$ was formed.

At this time, the degree of tensile force applied to respective joint portions of the wires 32 which are joined between electrode portions of the semiconductor chip 31 and the tip end portions 27a of inner leads 27 is determined by a ratio of rigidities of a plurality of gold wires and a rigidity of the hanging lead, and might be obtained through simulations.

For decreasing influences of the tensile force applied to the respective joint portions through the wires 32, it is effective to set the rigidity of the hanging lead small. Thus, the die pad 22 of the lead frame 60 is made small and the length of the hanging lead is made long to reduce the rigidity of the hanging lead. Consequently, the vacuum suction holes might be omitted in the wire bonding apparatus of a semiconductor device according to Embodiment 2.

Owing to the above-described arrangements of the present invention, the following effects might be exhibited.

The wire bonding apparatus for a semiconductor device according to one aspect of the present invention includes a heat block having an inner lead mounting portion for mounting the inner leads, a concave portion provided inward of the inner lead mounting portion and at least one supporting pad for mounting the semiconductor chip. With this arrangement, the inner leads might be mounted on the inner lead mounting portion and the semiconductor chip might be directly mounted on the supporting pad whereby it is possible to restrict influences of deformations such as inclinations or bows owing to difference in coefficient of thermal expansion of the semiconductor chip and the die pad at the time of performing wire bonding.

A wire bonding apparatus for a semiconductor device alternatively includes an heat block having an inner lead mounting portion for mounting the inner leads, a concave portion provided inward of the inner lead mounting portion while forming a clearance between portions to which die pad sinking has been performed, and at least one supporting pad for mounting the semiconductor chip provided within the concave portion while forming a difference in elevation with the inner lead mounting portion. With this arrangement, there can be prevented that force accompanying the contact acts on the die pad and the inner leads since portions to which die pad sinking has been performed does not directly come in contact with the concave portion even in the presence of manufacturing errors in die pad sinking. It is further possible to mount a semiconductor chip including small deformation on the supporting pad and the inner leads on the inner lead mounting portion. Therefore, it is possible to restrict influences of deformations such as inclinations or bows owing to difference in coefficient of thermal expansion of the semiconductor chip and the die pad at the time of or after performing wire bonding.

The supporting pad is so arranged that it further includes vacuum suction holes for sucking the semiconductor chip, whereby the semiconductor might be reliably fixed.

The apparatus is so arranged that it further includes a lead frame forcing means for pinching and holding the lead frame at regions other than the die pad and tip end portions of the inner leads between the inner lead mounting portion and the lead frame forcing means. With this arrangement, influences of restoration of the lead frame on wire bonding portions can be decreased at the time the lead frame forcing means is detached.

The method for wire bonding a semiconductor device according to a second aspect of the present invention includes the steps of mounting the inner leads on an inner lead mounting portion of a heat block, mounting the semiconductor chip on at least one supporting pad which is provided in a concave portion provided inward of the inner lead mounting portion, and pinching and holding the lead frame at portions other than the die pad and tip end portions of the inner leads between a lead frame forcing means and the inner lead mounting portion. With this arrangement, the inner leads might be mounted on the inner lead mounting portion and the semiconductor chip might be directly mounted on the supporting pad whereby it is possible to restrict influences of deformations such as inclinations or bows owing to difference in coefficient of thermal expansion of the semiconductor chip and the die pad at the time of performing wire bonding. It is further possible to decrease influences of restoration of the lead frame on wire bonded portions at the time the lead frame forcing means is detached.

In a device wherein the lead frame includes a hanging lead in which die pad sinking has been performed proximate to outward of the semiconductor chip for supporting the die pad, the method further includes the steps of arranging a concave portion of the head block such that a clearance is formed between portions of the lead frame to which die pad sinking has been performed, providing the supporting pad such that a difference in elevation is formed between the same and the inner lead mounting portion, and pinching and holding the lead frame by means of the lead frame forcing means at portions other than the die pad and tip end portions of the inner leads. With this arrangement, there can be prevented that force accompanying the contact acts on the die pad and the inner leads since portions to which die pad sinking has been performed does not directly come in contact with the concave portion even in the presence of manufacturing errors in die pad sinking. It is further possible to mount a semiconductor chip including small deformation on the supporting pad and the inner leads on the inner lead mounting portion. Therefore, it is possible to restrict influences of deformations such as inclinations or bows owing to difference in coefficient of thermal expansion of the semiconductor chip and the die pad at the time of or after performing wire bonding. It is further possible to decrease influences of restoration of the lead frame on wire bonded portions at the time the lead frame forcing means is detached.

The supporting pad is so arranged that it further includes vacuum suction holes for sucking the semiconductor chip, whereby the semiconductor chip might be reliably fixed.

What is claimed is:

1. A wire bonding method for electrically connecting electrodes of a semiconductor chip to respective inner leads of a lead frame, the lead frame comprising a peripheral frame, a die pad to which the semiconductor chip is bonded and toward which the inner leads extend from the peripheral frame, a plurality of hanging leads extending from the peripheral frame to the die pad, connected to and supporting the die pad, and a hanging lead reinforcement extending between and connecting respective pairs of the hanging leads, the hanging lead reinforcement being located closer to the die pad than to the peripheral frame, the method comprising:

mounting the inner leads on a planar inner lead mounting portion of a heat block, placing the die pad, the hanging lead reinforcement, and parts of the hanging leads proximate the die pad in a concave portion of the heat block, and placing the semicondutor chip in contact with planar surfaces of supporting pads of the heat block, the supporting pads projecting within the concave portion of the heat block, without establishing direct contact between the heat block and the die pad and the hanging lead reinforcement;

clamping the peripheral frame, the inner leads, except at tips proximate the semiconductor chip, and parts of the hanging leads remote from the die pad against the heat block;

wire bonding the electrodes of the semiconductor chip to respective tips of the inner leads; and releasing the clamping of the lead frame against the heat block.

2. The wire bonding method of claim 1, wherein the planar surfaces of the supporting pads are not coplanar with the planar inner lead mounting portion.

3. The wire bonding method of claim 1, wherein the heat block includes grooves receiving the hanging leads proximate the hanging lead reinforcement so the hanging leads proximate the hanging lead reinforcement do not contact the heat block when clamping the peripheral frame and the inner leads against the heat block.

4. The wire bonding method of claim 3, wherein the inner leads and the die pad are not coplanar, each of the hanging leads includes two bent portions, and the method includes placing the bent portions of the hanging leads in the concave portion of the heat block, but not in contact with the heat block, and placing parts of the hanging leads adjacent the bent portions in the grooves but not in contact with the heat block, before the clamping.

5. The wire bonding method of claim 1, wherein the supporting pads include vacuum suction holes, and including vacuum clamping of the semiconductor chip to the supporting pads during the wire bonding.

6. The method of claim 1 including clamping the parts of the hanging leads remote from the die pad against the heat block without deforming the hanging leads.

* * * * *